United States Patent
Iwamoto et al.

(10) Patent No.: US 7,372,112 B2
(45) Date of Patent: May 13, 2008

(54) SEMICONDUCTOR DEVICE, PROCESS FOR PRODUCING THE SAME AND PROCESS FOR PRODUCING METAL COMPOUND THIN FILM

(75) Inventors: Kunihiko Iwamoto, Ibaraki (JP); Toshihide Nabatame, Ibaraki (JP); Koji Tominaga, Kyoto (JP); Tetsuji Yasuda, Ibaraki (JP)

(73) Assignees: Rohm Co., Ltd. (JP); Renesas Technology Corp. (JP); Horiba, Ltd. (JP)

( * ) Notice: Subject to any disclaimer, the term of this patent is extended or adjusted under 35 U.S.C. 154(b) by 119 days.

(21) Appl. No.: 10/550,643

(22) PCT Filed: Mar. 24, 2005

(86) PCT No.: PCT/JP2004/004060

§ 371 (c)(1),
(2), (4) Date: Sep. 23, 2005

(87) PCT Pub. No.: WO2004/086511

PCT Pub. Date: Oct. 7, 2004

(65) Prior Publication Data

US 2006/0180877 A1  Aug. 17, 2006

(30) Foreign Application Priority Data

Mar. 25, 2003  (JP) .............................. 2003-083687

(51) Int. Cl.
*H01L 29/792* (2006.01)

(52) U.S. Cl. ...................... 257/411; 257/410; 257/324; 257/E29.132

(58) Field of Classification Search ................ 257/411
See application file for complete search history.

(56) References Cited

U.S. PATENT DOCUMENTS

2003/0176038 A1*  9/2003  Kobayashi et al. .......... 438/257
2005/0280104 A1* 12/2005  Li .............................. 257/406
2007/0001241 A1*  1/2007  Lim et al. .................... 257/410

FOREIGN PATENT DOCUMENTS

| JP | 59-011663 | 1/1984 |
| JP | 2002-299607 | 10/2002 |
| JP | 2003-008011 | 1/2003 |

OTHER PUBLICATIONS

The International Preliminary Report on Patentability for related International Application No. PCT/JP2004/0004060 mailed Mar. 2, 2006 with English translation.
International Search Report for Application No. PCT/JP2004/004060 mailed Jul. 13, 2004.

(Continued)

*Primary Examiner*—Sue A. Purvis
*Assistant Examiner*—Eduardo A. Rodela
(74) *Attorney, Agent, or Firm*—Cantor Colburn LLP

(57) ABSTRACT

A high dielectric gate insulating film having the structure that a high-nitrogen layer, a low-nitrogen layer, and a high-nitrogen layer are layered in this order from a silicon-substrate side.

4 Claims, 11 Drawing Sheets

OTHER PUBLICATIONS

Sanghun Jeon, et al., "Electrical characteristics of ZrOxNy prepared by NH3, annealing of ZrO2" Applied Physics Letters, vol. 79, No. 2, Jul. 9, 2001, pp. 245-247.

Hyung-Seok Jung et al. "Improved Current Performance of CMOSFETs with Nitrogen Incorporated HfO2-Al2O3 Laminate Gate Dielectric", Electron Devices Meeting, 2002, IEDM' 02.Digest. International, 2002, 12, pp. 853-856.

T. Nishimura et al. "Effects of Nitrogen Incorporation into HfAlOx Films on Gate Leakage Current—From XPS Study of Hf Bonding States", Extended Abstracts of International Workship On Gate Insulator 2003, 11, pp. 180-185.

* cited by examiner

SEMICONDUCTOR DEVICE, PROCESS FOR PRODUCING THE SAME AND PROCESS FOR PRODUCING METAL COMPOUND THIN FILM

BACKGROUND OF THE INVENTION

This is a U.S. national stage of application No. PCT/JP/2004/004060, filed on 24 Mar. 2004. Priority under 35 U.S.C. §119(a) and 35 U.S.C. §365(b) is claimed from Japanese Application No. 2003-083687, filed 25 Mar. 2003, the disclosure of which is also incorporated herein by reference.

FIELD OF THE INVENTION

The invention relates to a semiconductor device having a gate insulating film containing a metal nitride or a metal oxynitride, a method of manufacturing the same, and a method of manufacturing a metal compound thin film including nitrogen-containing metal compound layers by atomic layer deposition.

DESCRIPTION OF THE RELATED ART

Conventionally, MOSFETs have had a gate insulating film made of a silicon oxide film which has favorable leak current characteristics and a low interface state density. Now, if a transistor having a silicon oxide film as its gate insulating film is made finer in device size, then the gate insulating film is decreased in thickness. This increases a gate leak current due to tunnel currents. When the gate leak current is increased, a substantial leak current occurs in gate-off time. There can thus occur such problems that the semiconductor device fails to make proper circuit operation, and that the power consumption increases. To solve these problems, it has recently been examined to use a high dielectric film such as a metal oxide having a high dielectric constant as the material of the gate insulating film.

Nevertheless, a metal oxide film, the high dielectric, consists of an aggregate of polycrystalline particles and thus is likely to cause impurity and metal movements through the grain boundaries. As a result, dopant impurities and metal atoms of the gate electrode can sometimes penetrate the high dielectric gate insulating film to reach the channel region, thereby impairing the device reliability.

Moreover, it has been difficult for conventional high dielectric gate insulating films to provide favorable film quality stably due to problems in the deposition processes. At present, ALD (Atomic Layer Deposition) is considered promising as a method of depositing the high dielectric gate insulating film of a transistor. It has often been the case, however, that the material itself to be used by ALD resides in the high dielectric gate insulating film as impurities, or causes a film defect. Moreover, the films constituting the high dielectric gate insulating film have sometimes deviated from their designed stoichiometric mixture ratios, failing to provide desired film properties. These phenomena will be described with reference to FIGS. 1A and 1B. FIGS. 1A and 1B are schematic diagrams showing the layer structure of a high dielectric gate insulating film that is formed by ALD. FIGS. 1A and 1B correspond to the states before and after film improvement processing by thermal annealing, respectively. Before the thermal annealing, as shown in FIG. 1A, impurities are distributed throughout the high dielectric gate insulating film. After the annealing, impurities are removed from the entire film. The film can also be densified. Nevertheless, in the lower areas of the high dielectric gate insulating film or near the substrate in particular, impurities tend to be removed insufficiently and remain intact. In addition, since metal oxides are typically prone to crystallization, the film can be partially crystallized in the annealed state of FIG. 1B. The residual impurities and the film crystallization described above may contribute to deterioration in the characteristics of the device that contains the high dielectric gate insulating film. For example, those factors can cause an increase in leak current, deviations in threshold characteristic, etc.

Japanese Laid-Open Patent Application 2002-299607 has described the configuration of introducing nitrogen into a high dielectric gate oxide film of a MIS type transistor. Specifically, the document has described a method in which a high dielectric gate oxide film is formed and then heated in an ammonia atmosphere to form a diffusion barrier layer over the film. There has also been described a method in which a silicon nitride film is formed on a high dielectric gate oxide film, followed by heat treatment so that nitrogen segregates from the interface between the high dielectric gate oxide film and the silicon nitride film (paragraphs 0043 and 0046). These methods, according to the document, can be adopted to avoid the diffusion of impurities and metal atoms from the gate electrode.

Nevertheless, the methods described in the foregoing document are to distribute nitrogen unevenly toward the top of the film, and thus will not provide any effective finding as to the method of introducing nitrogen into the entire area of the high dielectric gate insulating film in a desired distribution. The effect of suppressing impurity and metal penetration is also limited. Besides, the methods will not provide any solution to the problems described with reference to FIGS. 1A and 1B, i.e., that the crystallization of the high dielectric gate insulating film and the residual impurities can cause deterioration in transistor performance.

Related Art List
JPA laid open 2002-299607

SUMMARY OF THE INVENTION

The present invention has been achieved in view of the foregoing circumstances. It is thus an object of the present invention to provide a semiconductor device having a highly-reliable gate insulating film which has a high dielectric constant and is less susceptible to impurity and metal diffusions. Another object of the present invention is to provide a method of manufacturing a nitrogen-containing metal compound thin film suited for such a semiconductor device with stability.

A first semiconductor device according to the present invention comprises: a semiconductor substrate; a gate insulating film formed on the semiconductor substrate; and a gate electrode formed on the gate insulating film. Here, the gate insulating film is a layered film including a plurality of nitrogen-containing metal compound layers having nitrogen atoms thermally diffused therein.

A second semiconductor device according to the present invention comprises: a semiconductor substrate; a gate insulating film formed on the semiconductor substrate; and a gate electrode formed on the gate insulating film. Here, the gate insulating film is a layered film including a plurality of nitrogen-containing metal compound layers having different nitrogen compositions (1–q), expressed by the following general formula:

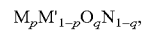

$$M_p M'_{1-p} O_q N_{1-q},$$

where $1 \geq p \geq 0$, $1 \geq q \geq 0$, and M and M' each represent an element selected from the group consisting of Hf, Zr, La, Al, Si, and Y.

A third semiconductor device according to the present invention comprises: a semiconductor substrate; a gate insulating film formed on the semiconductor substrate; and a gate electrode formed on the gate insulating film. Here, the gate insulating film is a layered film including a first metal compound layer containing a metal compound expressed by the chemical formula $M^1O_xN_{1-x}$, a second metal compound layer formed on the first metal compound layer, containing a metal compound expressed by the chemical formula $M^2O_yN_{1-y}$, and a third metal compound layer formed on the second metal compound layer, containing a metal compound expressed by the chemical formula $M^3O_zN_{1-z}$, where $1 \geq y > x \geq 0$, $1 \geq y > z \geq 0$, and $M^1$, $M^2$, and $M^3$ each independently represent an element selected from the group consisting of Hf, Zr, La, Al, Si, and Y.

A fourth semiconductor device according to the present invention comprises: a semiconductor substrate; a gate insulating film formed on the semiconductor substrate; and a gate electrode formed on the gate insulating film. Here, the gate insulating film includes a layered film including layers expressed by the following respective formulas:

, and

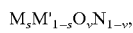, where $1 > r > 0$, $1 > s > 0$, $1 \geq u \geq 0$, $1 \geq v \geq 0$, and u and v are different values. M and M' represent different elements each selected from the group consisting of Hf, Zr, La, Al, Si, and Y.

A method of manufacturing a metal compound thin film according to the present invention comprises: forming a first metal compound layer on a substrate by atomic layer deposition; performing annealing on the first metal compound layer in an atmosphere containing a nitrogen compound gas, thereby diffusing nitrogen into the first metal compound layer; and forming a second metal compound layer on the first metal compound layer by atomic layer deposition.

A method of manufacturing a semiconductor device according to the present invention comprises: forming a gate insulating film and a conductive film on a semiconductor substrate in this order, the gate insulating film being made of a metal compound thin film; and selectively removing the gate insulating film and the conductive film to form a gate electrode. Here, the gate insulating film made of the metal compound thin film is formed by the foregoing method of manufacturing a metal compound thin film.

In the first semiconductor device according to the present invention, the gate insulating film includes the plurality of nitrogen-containing metal compound layers having nitrogen atoms thermally diffused therein. In general, metal oxide layers are high in insulation capability whereas they have a propensity toward crystallization and to pass leak current easily. When nitrogen is introduced thereto, the crystallization temperatures of the layers increase to enhance the film quality and make it harder to pass leak current. Among the previously known techniques for introducing nitrogen into a layer is one in which a metal nitride layer is formed by using such a deposition gas as ammonia or other nitrogen-containing gas. This method, however, is not intended to modify the metal oxide layers, but merely realizes the structure that a metal nitride layer is interposed between the metal oxide layers. When such a layer structure is applied to an electronic element such as a semiconductor device, leak current can sometimes occur from the areas of the metal oxide layers. In contrast, according to the method of the present invention, nitrogen penetrates and diffuses into the metal oxide layers. The metal oxide layers prone to crystallization are thus modified to be less prone to crystallization. Consequently, in such applications as transistors and other electronic elements, it is possible to achieve a thin film structure of smaller leak current.

The second, third, and fourth semiconductor devices according to the present invention have the gate insulating film which includes both low-nitrogen and high-nitrogen layers. The low-nitrogen layer has a relatively high dielectric constant and thus contributes to saving physical thickness. Meanwhile, the low-nitrogen layer has the problem that impurities and metal elements can easily diffuse inside the layer since it has a composition similar to that of an oxide layer. Then, the present invention adopts the configuration that the low-nitrogen layer is sandwiched between high-nitrogen layers, for example. These layers have high crystallization temperatures and have near amorphous form since high concentrations of nitrogen are introduced therein. Consequently, they function as layers for preventing impurity and metal diffusions. As a result, according to the present invention, it is possible to achieve a gate insulating film that has a high dielectric constant while suppressing diffusion and penetration of impurities and metal elements, and to achieve a highly-reliable semiconductor device of smaller leak current.

The third semiconductor device may be configured to satisfy $$C_1/C_2 \geq 2 \text{ or } C_3/C_2 \geq 2, \text{ and}$$

$$\text{preferably } C_1/C_2 \geq 10 \text{ or } C_3/C_2 \geq 10,$$

where $C_1$ is a maximum nitrogen concentration in the first metal compound layer, $C_2$ is a minimum nitrogen concentration in the second metal compound layer, and $C_3$ is a maximum nitrogen concentration in the third metal compound layer. It is also preferable that $C_1$ and $C_3$ both reach or exceed $3 \times 10^{20}$ atom/cm$^3$, where $C_1$ is a maximum nitrogen concentration in the first metal compound layer, and $C_3$ is a maximum nitrogen concentration in the third metal compound layer. As a result, it becomes possible to achieve a semiconductor device having a highly-reliable gate insulating film which has a high dielectric constant and is less susceptible to impurity and metal diffusions.

In the semiconductor devices of the present invention described above, a metal diffusion barrier film may be formed as the lowermost layer of the gate insulating film. This makes it possible to suppress metal and impurity diffusions from the metal compound thin film to the semiconductor substrate with even higher reliability.

In the semiconductor devices according to the present invention, the nitrogen-containing layers in the gate insulating film may be metal oxide layers or metal oxynitride layers having nitrogen diffused therein. More specifically, annealing may be performed in an atmosphere containing a nitrogen compound gas, thereby diffusing nitrogen into the metal compound layers. As described previously, nitrogen can penetrate and diffuse into the metal oxide layers so that the metal oxide layers prone to crystallization are modified to be less prone to crystallization. Consequently, in such applications as transistors and other electronic elements, it is possible to achieve a thin film structure of smaller leak current.

In the semiconductor devices according to the present invention, each individual metal compound layer constituting the gate insulating film is not limited to any particular thickness. For example, thicknesses in the range of 0.2 to 5 nm are applicable. This makes it possible to achieve finer devices. With such thicknesses, it is of importance to exercise sophisticated control on the nitrogen concentration profile in the metal compound thin film. To achieve such a sophisticated profile control requires in turn the use of a system that is capable of deposition, impurity gas introduction, and annealing in an identical reaction chamber. In addition, the system must also have a structure capable of heating the base material quickly after the formation of the layers, and cooling the base material quickly after the annealing. It has been extremely difficult, however, for conventional deposition systems to perform such processes because of their structures. Then, the inventors have developed a new system capable of both annealing and deposition as will be described later, have realized sophisticated control on the nitrogen concentration profile possible by using the system, and have thus achieved the present invention.

As described above, according to the present invention, it is possible to achieve a transistor having a highly-reliable gate insulating film which has a high dielectric constant and is less susceptible to impurity and metal diffusions.

Moreover, according to the present invention, a metal compound thin film suited for such a transistor and the like can be manufactured stably.

BRIEF DESCRIPTION OF THE DRAWINGS

The foregoing objects and other objects, features, and advantages of the invention will become more apparent from the following description of preferred embodiments when read in conjunction with the accompanying drawings, in which.

DETAILED DESCRIPTION OF THE INVENTION

First Embodiment

An MIS type transistor according to the present embodiment comprises a gate insulating film having a distribution of nitrogen concentration inside. When nitrogen is introduced into a metal oxide film, the crystallization temperature of the film increases to enhance the film quality as well as improve the thermal and chemical stabilities. This also lowers the barrier against electron, and facilitates trapping electron. For this reason, when nitrogen-introduced regions are formed inside the gate insulating film, it is of importance to control the positions of the regions optimally for the most preferable transistor performance. The present embodiment will disclose a transistor having such a structure.

Figure 1A:
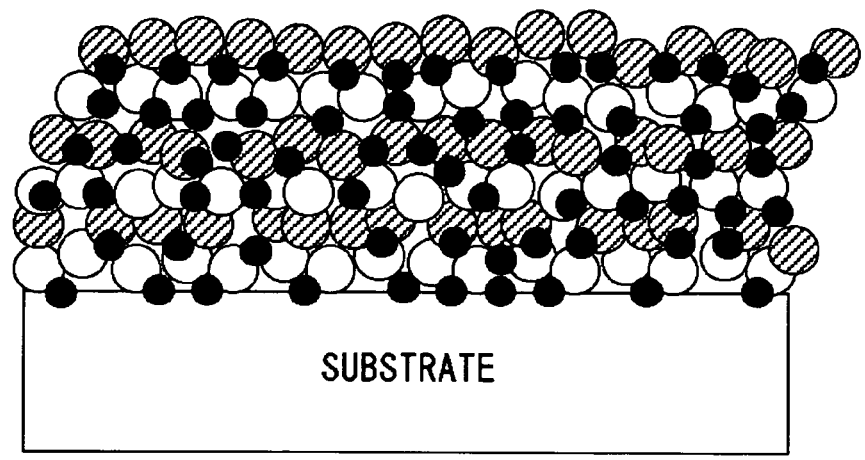
FIGS. 1A and 1B are schematic diagrams showing the layer structure of a high dielectric gate insulating film which is formed by ALD.
Figure 1B:
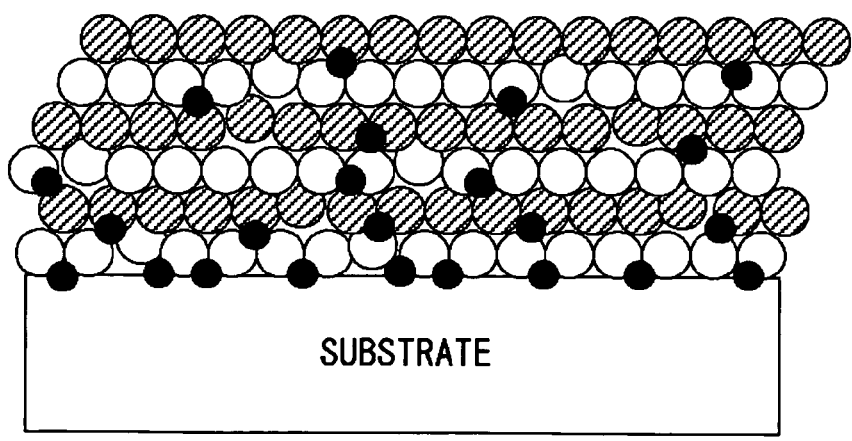
Figure 2A:
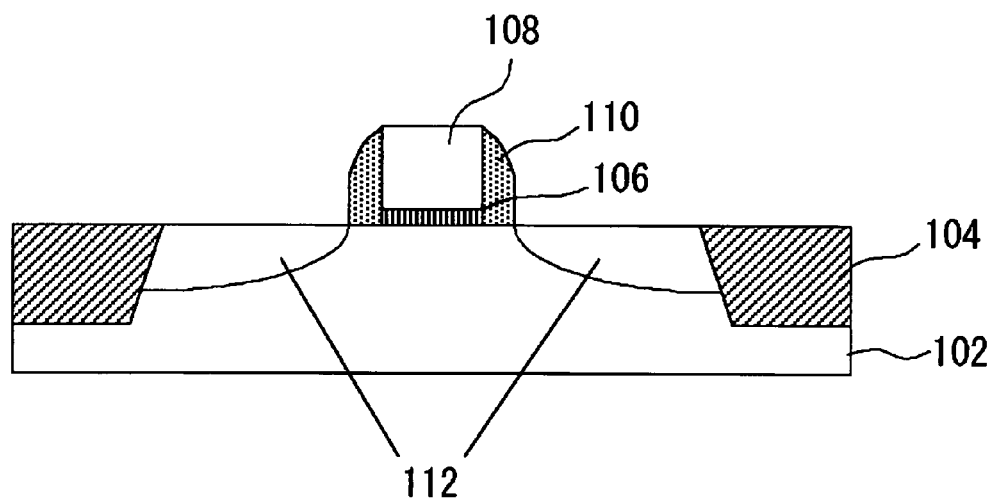
FIGS. 2A and 2B are diagrams showing the structure of an MIS type transistor to be described in an embodiment.
Figure 2B:
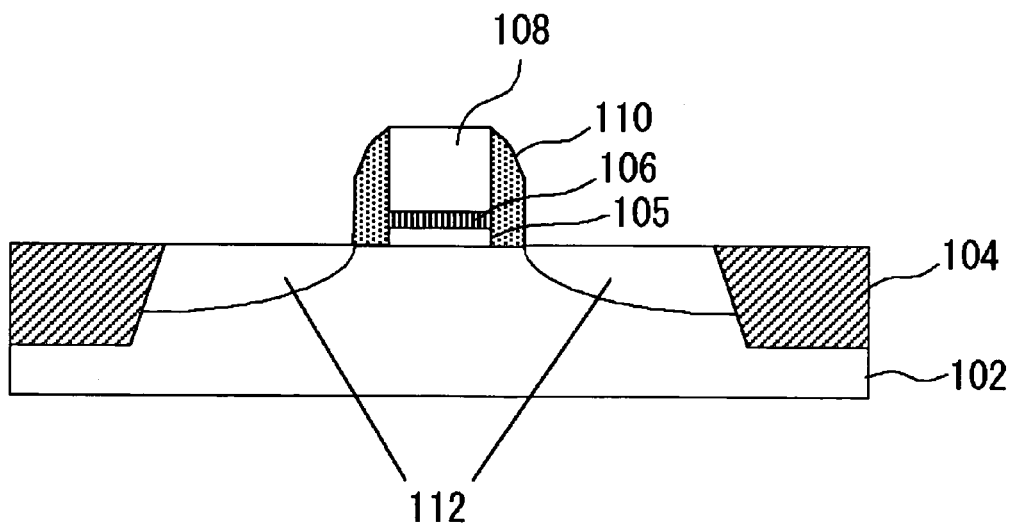

FIGS. 2A and 2B show general structures of the transistor according to the present embodiment. The transistor shown in FIG. 2A is formed in a device region on the surface of a silicon substrate 102, isolated by a device isolation film 104. A gate electrode 108 is formed on the surface of the silicon substrate 102 with a high dielectric gate insulating film 106 therebetween. Sidewalls 110 are formed on both sides. Impurity diffused layers 112 are formed near the surface of the silicon substrate 102, lying on both sides of the gate electrode 108.

The high dielectric gate insulating film 106 has a layer structure in which the following layers (i) to (iii) are layered in this order from the silicon substrate 102:

(i) a first metal compound layer containing a metal compound expressed by the chemical formula $M^1N_{1-x}O_x$;

(ii) a second metal compound layer containing a metal compound expressed by the chemical formula $M^2N_{1-y}O_y$; and (iii) a third metal compound layer containing a metal compound expressed by the chemical formula $M^3N_{1-z}O_z$.

$M^1$, $M^2$, and $M^3$ each represent a metal element selected from the group consisting of Hf, Zr, La, Al, Si, and Y.

Here, x, y, and z satisfy $1 \geq y > x \geq 0$, and $1 \geq y > z \geq 0$. It is preferable that x, y, z fall within the following ranges, respectively:

$$0.7 \leq x \leq 0.95;$$

$$0.9 \leq y \leq 1; \text{ and}$$

$$0.7 \leq z \leq 0.95.$$

This structure allows a further improvement in dielectric constant, further suppression of the diffusion of oxygen and metal elements, and a reduction in leak current.

More specifically, the first metal compound layer (i) and the third metal compound layer (iii) have nitrogen concentrations higher than that of the second metal compound layer (ii). In this structure, as viewed upward from the silicon substrate 102, a high-nitrogen layer, a low-nitrogen layer, and a high-nitrogen layer are layered in this order. The high-nitrogen layers are formed, for example, by depositing oxide films by ALD and then introducing nitrogen into the films in an annealing step as will be described later.

When nitrogen is introduced into the oxide films, the crystallization temperatures of the films increase for enhanced film quality. That is, the high-nitrogen layers themselves show favorable film quality.

The high-nitrogen layers also play the role of interrupting the diffusion of metal elements and oxygen in the metal oxide films. Since the high dielectric gate insulating film 106 has the layer structure that the high-nitrogen layers are arranged at the top and the bottom, the diffusion of those substances out of the high dielectric gate insulating film 106 can be suppressed effectively.

Moreover, the high-nitrogen layers are thermally and chemically stable, and less likely to react with silicon or silicon oxide films to form alloys. In general, when a gate insulating film made of a film having a high dielectric constant is arranged on a silicon substrate, the high-dielectric-constant film and silicon can react with each other at the interface, thereby producing a silicide or silicate thin film. This causes a drop in dielectric constant and, by extension, an increase in equivalent thickness. The present embodiment can solve this problem because one of the high-nitrogen layers having poor reactivity is arranged next to the silicon substrate 102.

Moreover, the high dielectric gate insulating film 106 according to the present embodiment has the low-nitrogen layer at the center. The low-nitrogen layer has a barrier higher than that of the high-nitrogen layers, and thus contributes to reduced leak current.

As described above, the high dielectric gate insulating film 106 according to the present embodiment fully utilizes the properties of both the high-nitrogen and low-nitrogen layers. This achieves the structure that suppresses the diffusion of the elements constituting the high dielectric gate insulating film 106, restrains the reaction with the adjoining silicon substrate, and reduces leak current.

FIG. 2B shows a transistor structure which is different from that of FIG. 2A in that a metal diffusion barrier film 105 is arranged between the silicon substrate 102 and the high dielectric gate insulating film 106. The provision of such a structure allows an improvement to the film quality of the high dielectric gate insulating film 106. This can further ensure that the silicon substrate 102 and the high dielectric gate insulating film 106 be prevented from reacting with each other to produce a silicide or silicate thin film at the interface therebetween. The metal diffusion barrier film 105 may be made of a metal nitride film. Specific examples include an aluminum nitride film (AlN), an aluminum oxynitride film (AlON), and a silicon nitride film.

Figure 3A:
FIGS. 3A to 3E are diagrams showing the steps of manufacturing the transistor shown in FIG. 2A.

FIGS. 3A to 3E are diagrams showing the steps of manufacturing the transistor shown in FIG. 2A. Initially, as shown in FIG. 3A, a device isolation film 104 having a shallow trench isolation (STI) structure is formed in a silicon substrate 102 by using a known method. Next, a high dielectric gate insulating film 106 is formed over the entire surface of the substrate. The high dielectric gate insulating film 106 has the foregoing layer structure and is formed by ALD. The method of depositing the high dielectric gate insulating film 106 will be detailed later.

Figure 3B:
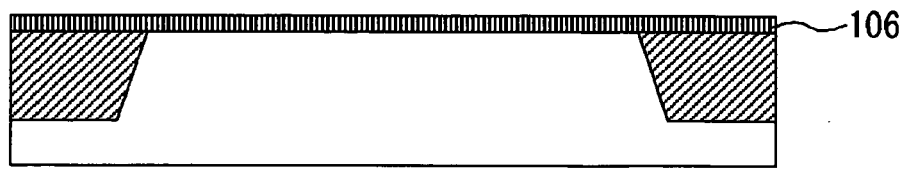
Figure 3C:
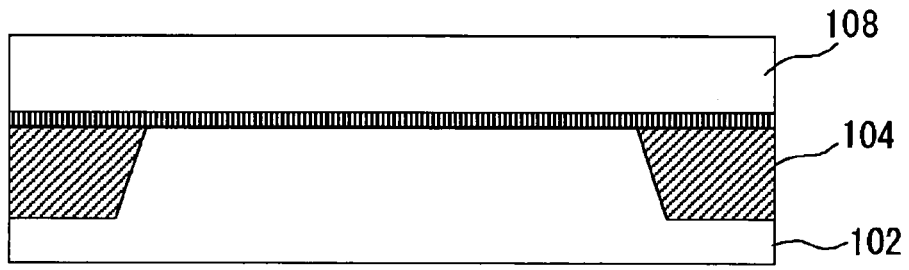
Figure 3D:
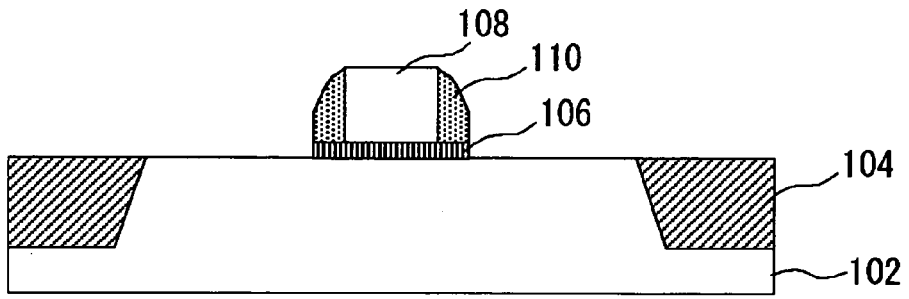
Figure 3E:
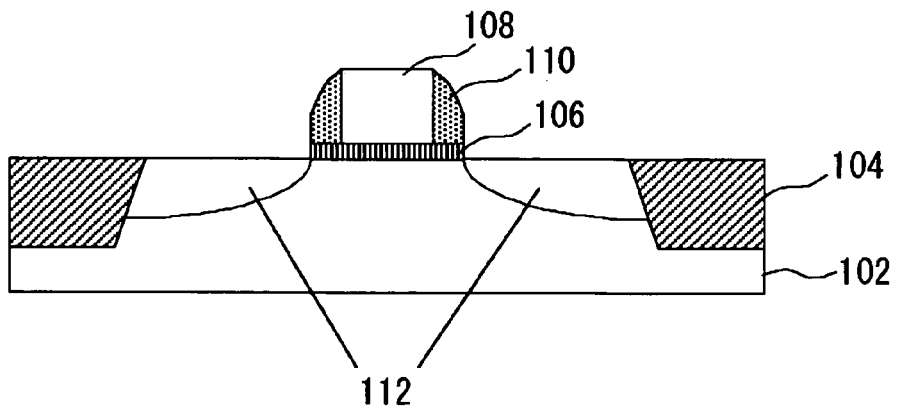

Subsequently, a gate electrode 108 is deposited on the high dielectric gate insulating film 106 (FIG. 3C). The gate electrode 108 and the high dielectric gate insulating film 106 are removed selectively, and sidewalls 110 are then formed on both sides by CVD. As a result, the gate electrode is formed (FIG. 3D). Subsequently, impurities are injected into near the surface of the silicon substrate 102, on both sides of the gate electrode, thereby forming the impurity diffused layers 112 (FIG. 3E). The MIS type transistor can be fabricated through the foregoing steps.

Now, description will be given of the method of depositing the high dielectric gate insulating film 106 in the step mentioned above. Here, the description will deal with an example where AlON, $Al_2O_3$, and AlON are layered in this order on the silicon substrate by ALD.

Figure 4A:
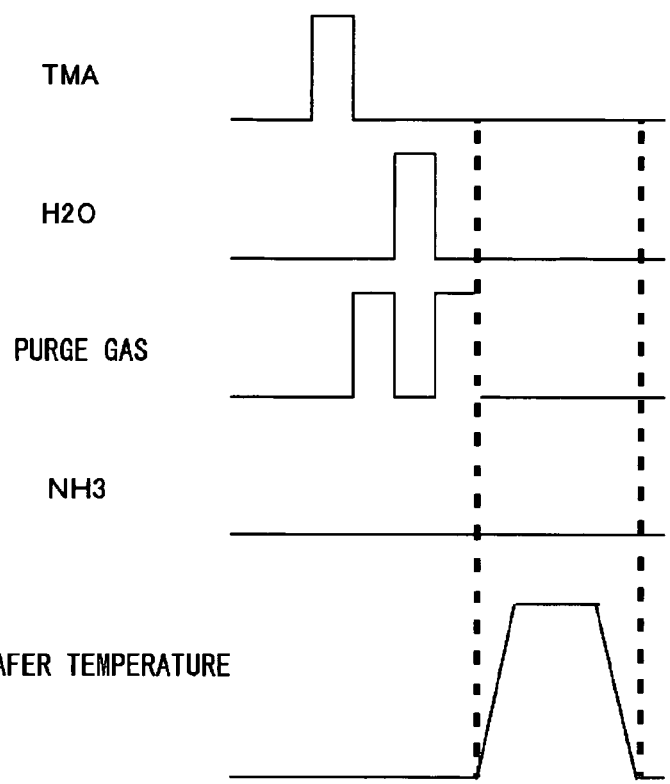
FIGS. 4A and 4B are charts showing examples of the gas supply and temperature profile in the process of depositing a high dielectric gate insulating film.
Figure 4B:
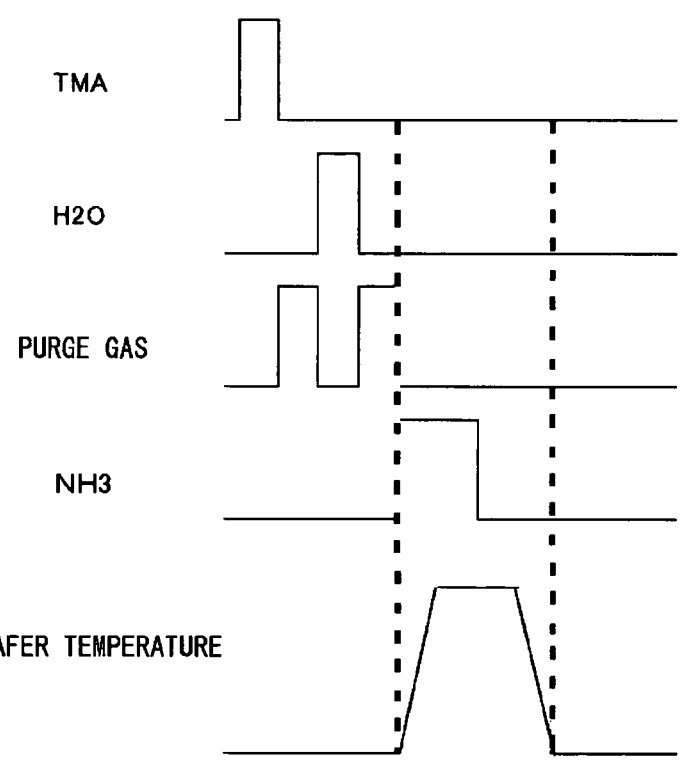

The gas supply and temperature profiles in the deposition processes appear in FIGS. 4A and 4B. FIG. 4A shows the sequence of gas introduction and temperature profile for depositing $Al_2O_3$. FIG. 4B shows the sequence for depositing AlON. The high dielectric gate insulating film 106 according to the present embodiment is deposited by using these sequences in combination. In FIG. 4A, trimethyl ammonium (TMA), a source gas, is initially introduced to form an aluminum atomic layer. Subsequently, the reaction chamber is purged inside by using a purge gas. Then, $H_2O$ gas, a reactive gas, is introduced to form an oxygen atomic layer. Both the aluminum atomic layer and the oxygen atomic layer are formed at temperatures of around 150° C. to 450° C. Next, thermal annealing is performed for the sake of impurity removal and film densification. The annealing temperature and time are 600° C. to 1050° C. and 1 to 600 sec, for example. The rate of temperature rise during annealing is 100° C./sec or higher.

In FIG. 4B, the aluminum atomic layer and the oxygen atomic layer are formed as in FIG. 4A. Then, annealing is performed with a flow of ammonia, thereby introducing nitrogen into $Al_2O_3$. The annealing temperature and time are the same as in FIG. 4A, or 600° C. to 1050° C. and 1 to 600 sec, for example. The rate of temperature rise during annealing is 100° C./sec or higher.

The sequences described above can be performed in the order of FIGS. 4B, 4A, and 4B to form a metal compound thin film having AlON, $Al_2O_3$, and AlON layered in this order.

According to the method described above, sophisticated control on the amount of nitrogen to be introduced can be effected by such means as an adjustment to the annealing conditions. Moreover, a desired distribution of nitrogen concentration can be stably formed inside the high dielectric gate insulating film.

Figure 5A:
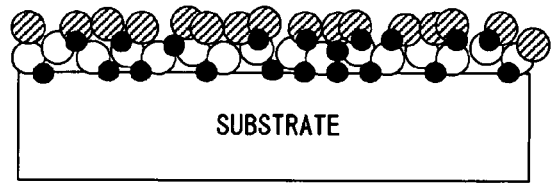
FIGS. 5A to 5D are diagrams schematically showing the process of depositing $Al_2O_3$ in FIG. 3B.
Figure 5B:
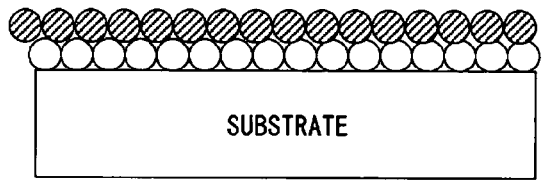
Figure 5C:
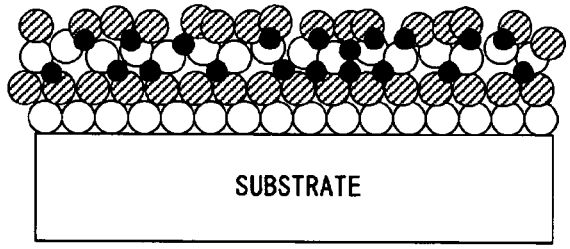
Figure 5D:
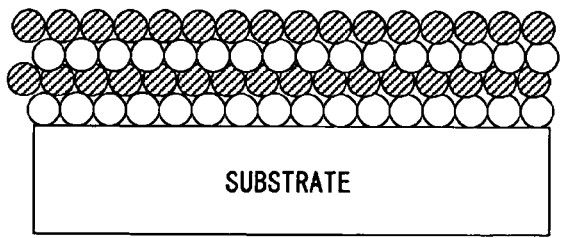

FIGS. 5A to 5D are diagrams schematically showing the process of depositing $Al_2O_3$ (corresponding to FIG. 5A) in the step of FIG. 3B. FIG. 5A shows a state in which a metal atomic layer and an oxygen atomic layer are deposited independently on the substrate. These layers contain impurities. Then, thermal annealing is performed to remove impurities from the film and densify the film as shown in FIG. 5B. FIGS. 5C and 5D show the layer structure at the respective stages after the foregoing steps are repeated. As shown in FIG. 5D, impurities can be reduced by the thermal annealing. Moreover, in the annealing step, a nitrogen-containing compound gas such as ammonia gas can be flowed to introduce nitrogen into the layers while removing the impurities.

What are important in practicing the process of depositing the high dielectric gate insulating film 106 described above are as follows: to increase the wafer temperature quickly to perform annealing without taking the substrate out of the deposition chamber; and to lower the wafer temperature sharply so as not to hinder the next deposition step. These requirements have been unattainable by conventional deposition systems. Then, the inventors have developed a new system capable of performing both deposition and annealing, and thereby made the foregoing process feasible. Hereinafter, this new deposition system will be overviewed.

Figure 6:
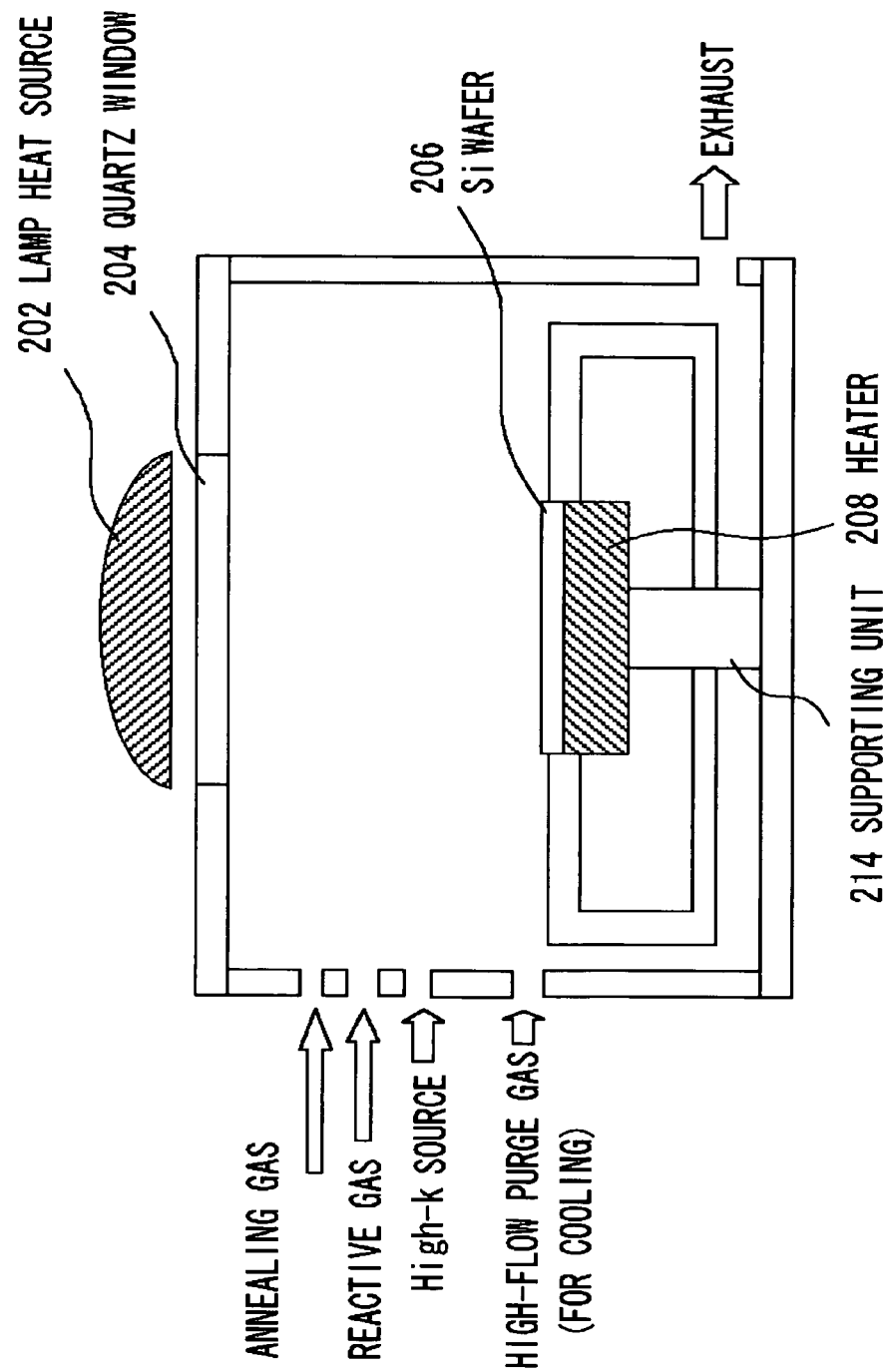
FIG. 6 is a diagram showing the general structure of a deposition system for forming a high dielectric insulating film.

FIG. 6 shows an example of the deposition system for achieving the foregoing process. In the shown deposition system 200, an Si wafer 206 is placed on a heater 208. The heater 208 is supported by a supporting unit 214. Inlets for an annealing gas, a reactive gas ($H_2O$), a source gas of high-k, and a purge gas are formed inside the system. An outlet for exhausting the gases out of the deposition chamber is formed in the right side of the system.

A lamp heat source 202 is arranged over a quartz window 204. The Si wafer 206 is maintained at a predetermined temperature by the heater 208 during deposition, and is heated quickly by the lamp heat source 202. In other words, the heater 208 is a heat source for maintaining the deposition temperature, and the lamp heat source 202 is a heat source for reaching the annealing temperature.

In this system, the deposition chamber is formed at a small volume ratio with respect to the flow rate of the purge gas. The interior of the deposition chamber can thus be replaced with the cooling purge gas of a high flow rate in a short time. This makes it possible to lower the temperature sharply. Moreover, the lamp heat source attached to the deposition system 200 allows a quick rise in temperature by lamp annealing.

Figure 7:
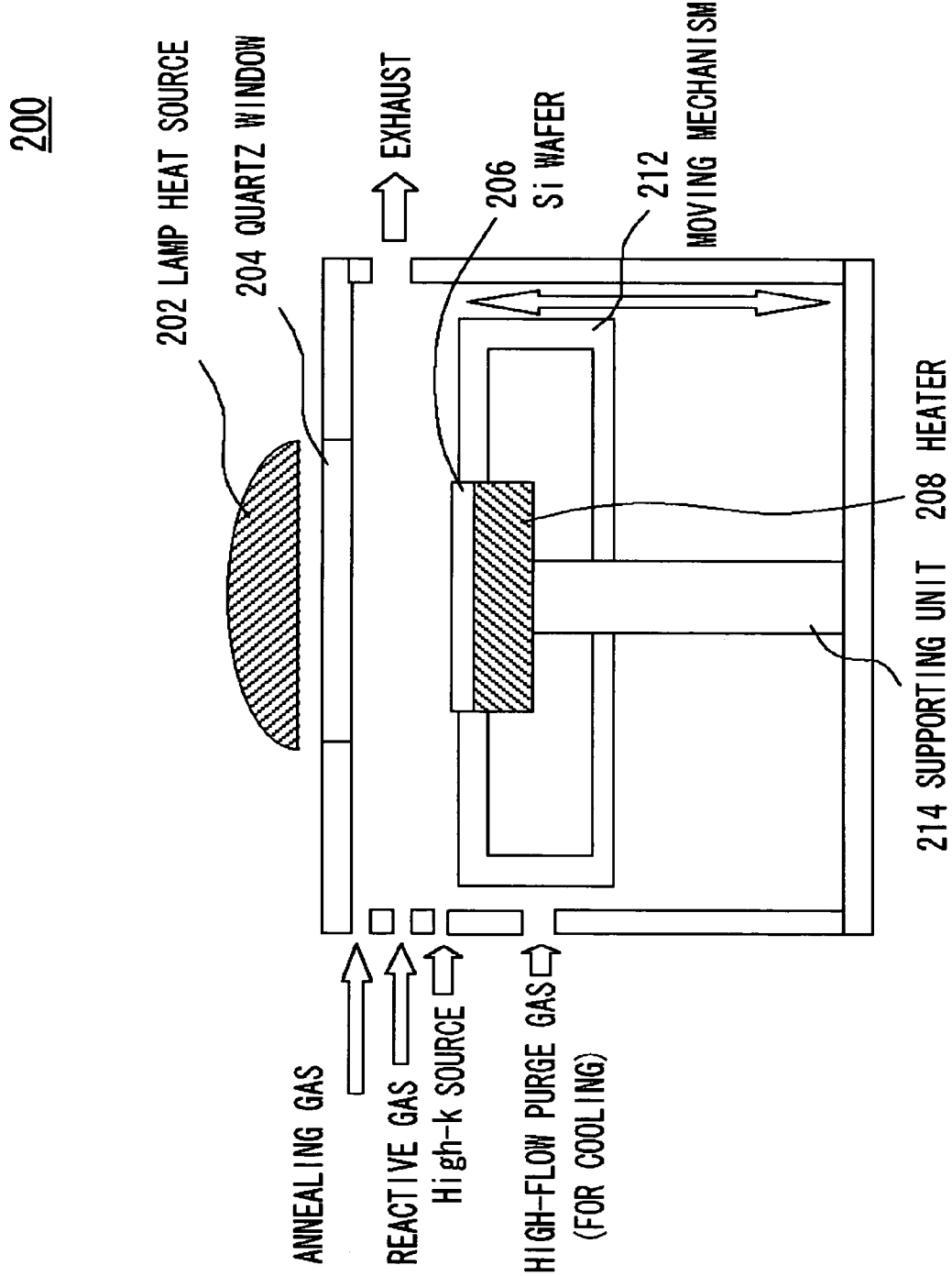
FIG. 7 is a diagram showing the general structure of a deposition system for forming a high dielectric insulating film.

FIG. 7 shows another example of the system. In this system, the Si wafer 206 is placed on a moving mechanism 212 so that it can be displaced in the height direction. For quick heating, the Si wafer 206 is moved up to approach the lamp heat source 202. For quick cooling, the Si wafer 206 is moved down in turn so that it draws apart from the lamp heat source 202. At the same time, the interior of the chamber is cooled by a large amount of purge gas. The heater 208, the supporting unit 214, and the gas supply channels have the same structures as in FIG. 6.

Due to the configuration capable of adjusting the distance between the lamp heat source 202 and the Si wafer 206, the system shown in FIG. 7 is better suited to quick heating and quick cooling.

Second Embodiment

The present embodiment provides a structure different from the transistor shown in FIG. 2A in that the high dielectric gate insulating film 106 is formed by layering AlON, $HfO_2$, and AlN in this order. The deposition is carried out by using the system shown in FIG. 7. Trimethyl ammonium is used as the source gas of Al. For Hf, such source gases as hafnium chloride ($HfCl_4$) and $Hf(NO_3)_4$ may be used. In the present embodiment, hafnium chloride ($HfCl_4$) is used.

Figure 8:
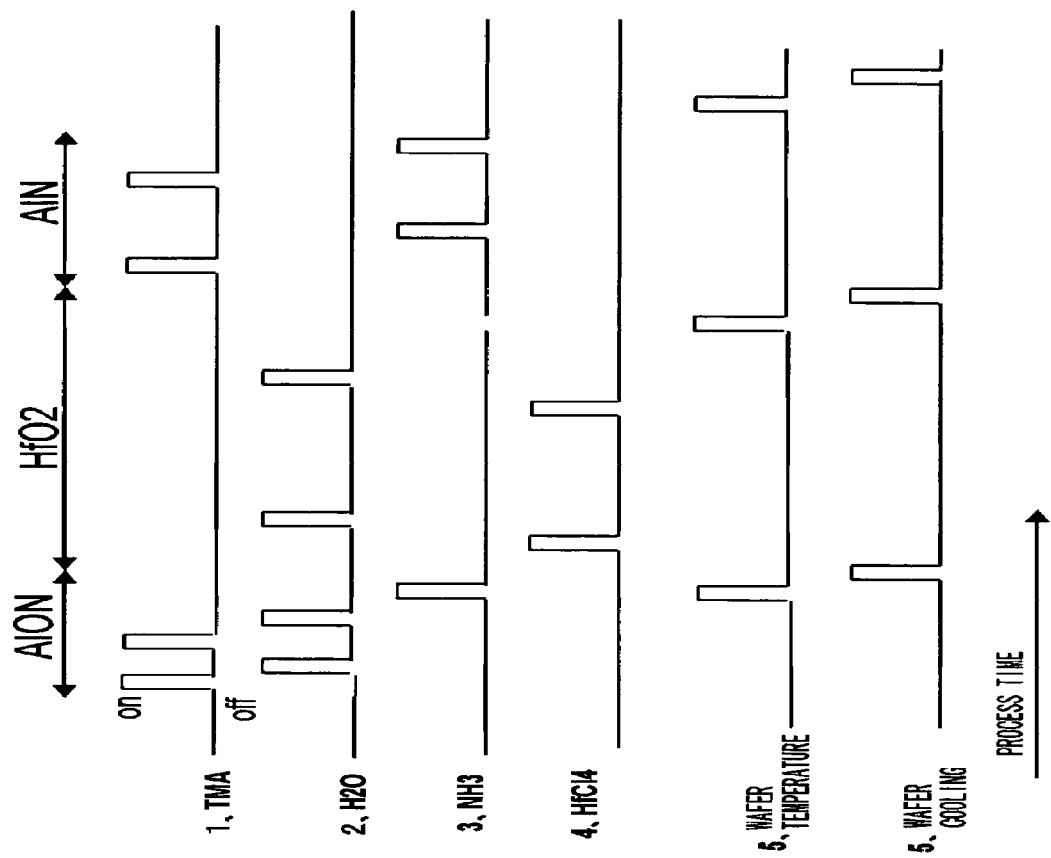
FIG. 8 is a chart showing an example of the gas supply and temperature profile in the process of depositing a high dielectric gate insulating film.

FIG. 8 shows the sequence of gas introduction and temperature profile for depositing the high dielectric gate insulating film 106 having the foregoing structure. Initially, trimethyl ammonium (TMA), the source gas, is introduced to form an aluminum atomic layer. Subsequently, the reaction chamber is purged inside by using a purge gas. Then, $H_2O$ gas, a reactive gas, is introduced to form an oxygen atomic layer. Both the aluminum atomic layer and the oxygen atomic layer are formed at temperatures of around 150° C. to 450° C. Next, thermal annealing is performed with a flow of ammonia. The annealing temperature and time are 600° C. to 1050° C. and 1 to 600 sec, for example. The rate of temperature rise during annealing is 100° C./sec or higher. As a result, AlON is deposited.

Next, the steps of introducing hafnium chloride ($HfCl_4$) and $H_2O$ gases are repeated in this order to deposit $HfO_2$.

Subsequently, the steps of introducing TMA and $NH_3$ gases are repeated in this order to deposit AlN.

Through the foregoing steps, AlON, $HfO_2$, and AlN are layered in this order to form a layered structure including a plurality of nitrogen-containing metal compound layers which have different nitrogen compositions. According to this method, sophisticated control on the amount of nitrogen to be introduced into AlON can be effected by such means as an adjustment to the annealing conditions.

In the present embodiment, the high dielectric gate insulating film 106 is formed by using two different types of metals. Besides, nitrogen is distributed into the high dielectric gate insulating film 106 in high, low, and high concentrations as seen from the substrate. Consequently, it is possible to suppress the diffusion of the elements constituting the high dielectric gate insulating film 106, restrain the reaction with the adjoining silicon substrate, and reduce the leak current effectively.

Third Embodiment

The present embodiment provides a structure different from the transistor shown in FIG. 2A in that the high dielectric gate insulating film 106 is formed by layering AlON, HfAlON, and AlN in this order. The deposition is carried out by using the system shown in FIG. 7. Trimethyl ammonium is used as the source gas of Al. For Hf, such source gases as hafnium chloride ($HfCl_4$) and $Hf(NO_3)_4$ may be used. In the present embodiment, hafnium chloride ($HfCl_4$) is used.

Figure 9:
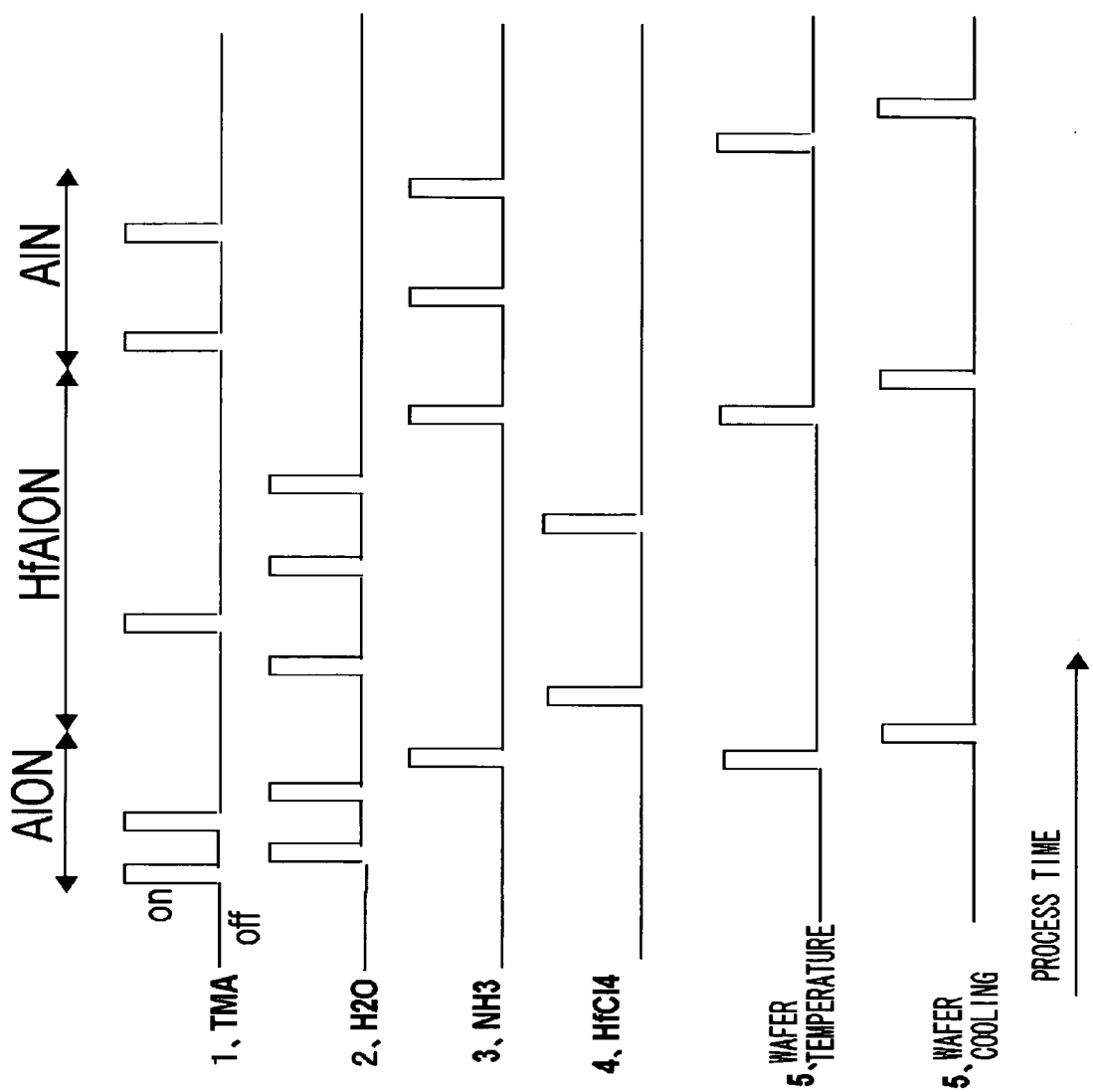
FIG. 9 is a chart showing an example of the gas supply and temperature profile in the process of depositing a high dielectric gate insulating film.

FIG. 9 shows the sequence of gas introduction and temperature profile for depositing the high dielectric gate insulating film 106 having the foregoing structure. Initially, trimethyl ammonium (TMA), the source gas, is introduced to form an aluminum atomic layer. Subsequently, the reaction chamber is purged inside by using a purge gas. Then, $H_2O$ gas, a reactive gas (here, oxidizing gas), is introduced to form an oxygen atomic layer. Both the aluminum atomic layer and the oxygen atomic layer are formed at temperatures of around 150° C. to 450° C. Next, thermal annealing is performed with a flow of ammonia. The annealing temperature and time are 600° C. to 1050° C. and 1 to 600 sec, for example. The rate of temperature rise during annealing is 100° C./sec or higher. As a result, AlON is deposited.

Next, the step of introducing $HfCl_4$, $H_2O$, TMA, $H_2O$, $HfCl_4$, and $H_2O$ gases are repeated in this order to deposit HfAlO. Subsequently, thermal annealing is performed with a flow of ammonia, whereby nitrogen is introduced into HfAlO to form HfAlON. The annealing temperature and time are 600° C. to 1050° C. and 1 to 600 sec, for example. The rate of temperature rise during annealing is 100° C./sec or higher.

Subsequently, the steps of introducing TMA and $NH_3$ gases are repeated in this order to deposit AlN.

As a result, a structure having AlON, HfAlON, and AlN layered in this order is formed. According to this method, sophisticated control on the amount of nitrogen to be introduced into HfAlON can be effected by such means as an adjustment to the annealing conditions.

In the present embodiment, the high dielectric gate insulating film 106 is formed by using two different types of metals. Besides, nitrogen is distributed into the high dielectric gate insulating film 106 in high, low, and high concentrations as seen from the substrate. Consequently, it is possible to suppress the diffusion of the elements constituting the high dielectric gate insulating film 106, restrain the reaction with the adjoining silicon substrate, and reduce the leak current effectively.

Fourth Embodiment

Figure 10A:
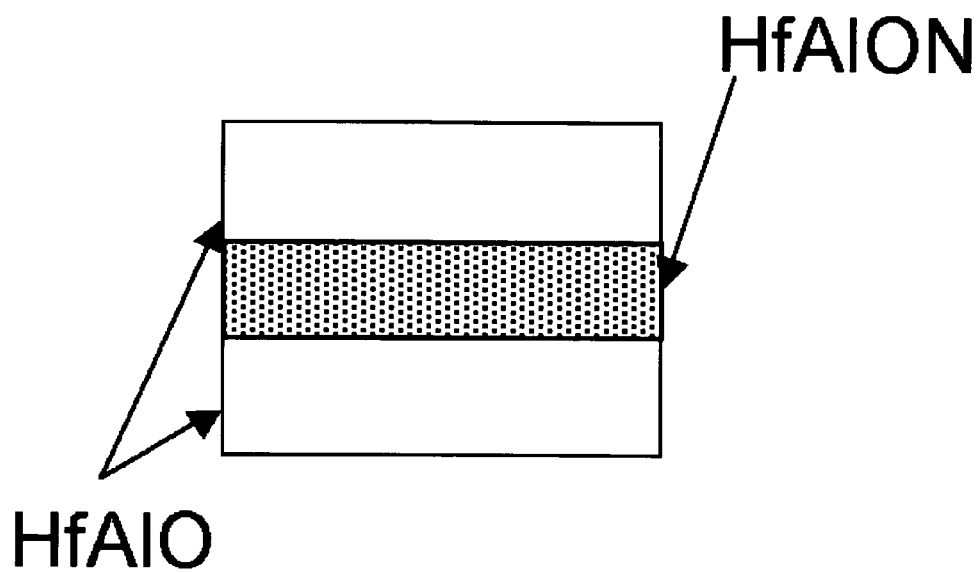
FIGS. 10A and 10B are diagrams showing examples of the structure of the high dielectric gate insulating film.
Figure 10B:
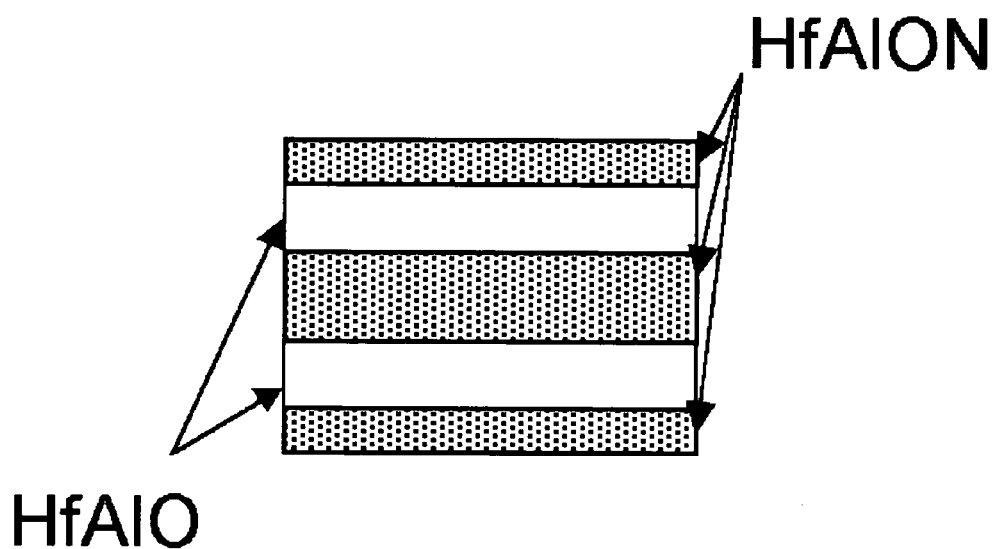

The present embodiment differs from the transistor shown in FIG. 2A in that the high dielectric gate insulating film 106 has either one of layered structures shown in FIGS. 10A and 10B. FIG. 10A shows a structure in which HfAlO, HfAlON, and HfAlO are layered in this order. FIG. 10B shows a structure in which HfAlO and HfAlON are layered alternately. HfAlO and HfAlON can be formed by the deposition methods described previously.

The use of the gate insulating films having the structures shown in FIGS. 10A and 10B allows an effective reduction of the leak current as well as suitable control on the flat band voltage (Vfb).

Up to this point, description has been given of the embodiments of the present invention. It will be understood by those skilled in the art that the foregoing embodiments are given for illustration purpose only, and various modifications may be made thereto. All such modifications are also intended to fall within the scope of the present invention.

For example, the foregoing embodiments have dealt with high dielectric gate insulating films containing aluminum and hafnium. This is not restrictive, and various metal compound layers containing Zr, La, Si, Y, or the like may be suitably used.

Specifically, the examples of available materials include metal oxides such as $ZrO_2$, $HfO_2$, $(Zr,Hf)O_2$, $Al_2O_3$, $Y_2O_3$, and $La_2O_3$, and metal oxynitrides formed by introducing nitrogen to foregoing metal oxides. Silicon and other elements may also be introduced to these metal compounds if necessary.

PRACTICAL EXAMPLE

A MIS type transistor having the structure shown in FIG. 2A was fabricated. The high dielectric gate insulating film 106 was made of a metal compound thin film including a plurality of AlON layers having different nitrogen concentrations, formed by ALD. This thin film was deposited in a deposition system having the structure shown in FIG. 7. This system was capable of quick heating by lamp annealing. The deposition chamber was also capable of quick cooling inside by rapid exhaust.

The transistor was formed by the processes according to the embodiment described with reference to FIGS. 3A to 3E. In the process of depositing the high dielectric gate insulating film 106, the gas supply and the temperature profile were generally the same as shown in FIGS. 4A and 4B. Initially, as shown in FIG. 4A, trimethyl ammonium (TMA) as a source gas was introduced to form an aluminum atomic layer (step A). The deposition chamber was purged inside before $H_2O$ gas, an oxidant, was introduced to form an oxygen atomic layer (step B). Both aluminum and oxygen were deposited at temperatures of around 150° C. to 450° C. Next, thermal annealing was performed for the sake of impurity removal and film densification. The annealing temperature and time was 600° C. to 1050° C. and 1 to 600 sec, for example. The rate of temperature rise during annealing was 100° C./sec or higher (step C).

The foregoing steps A to C were repeated, and then the nitrogen introducing processing was performed when the layer reached a predetermined thickness. That is, as shown in FIG. 4B, $NH_3$ was supplied during annealing. Consequently, nitrogen was introduced and diffused into the layer. The annealing conditions here were the same as described above.

The high dielectric gate insulating film having the layer structure including a plurality of AlON layers of different nitrogen concentrations was formed in the foregoing manner. Subsequently, a transistor was formed by the procedure stated previously.

Figure 11:
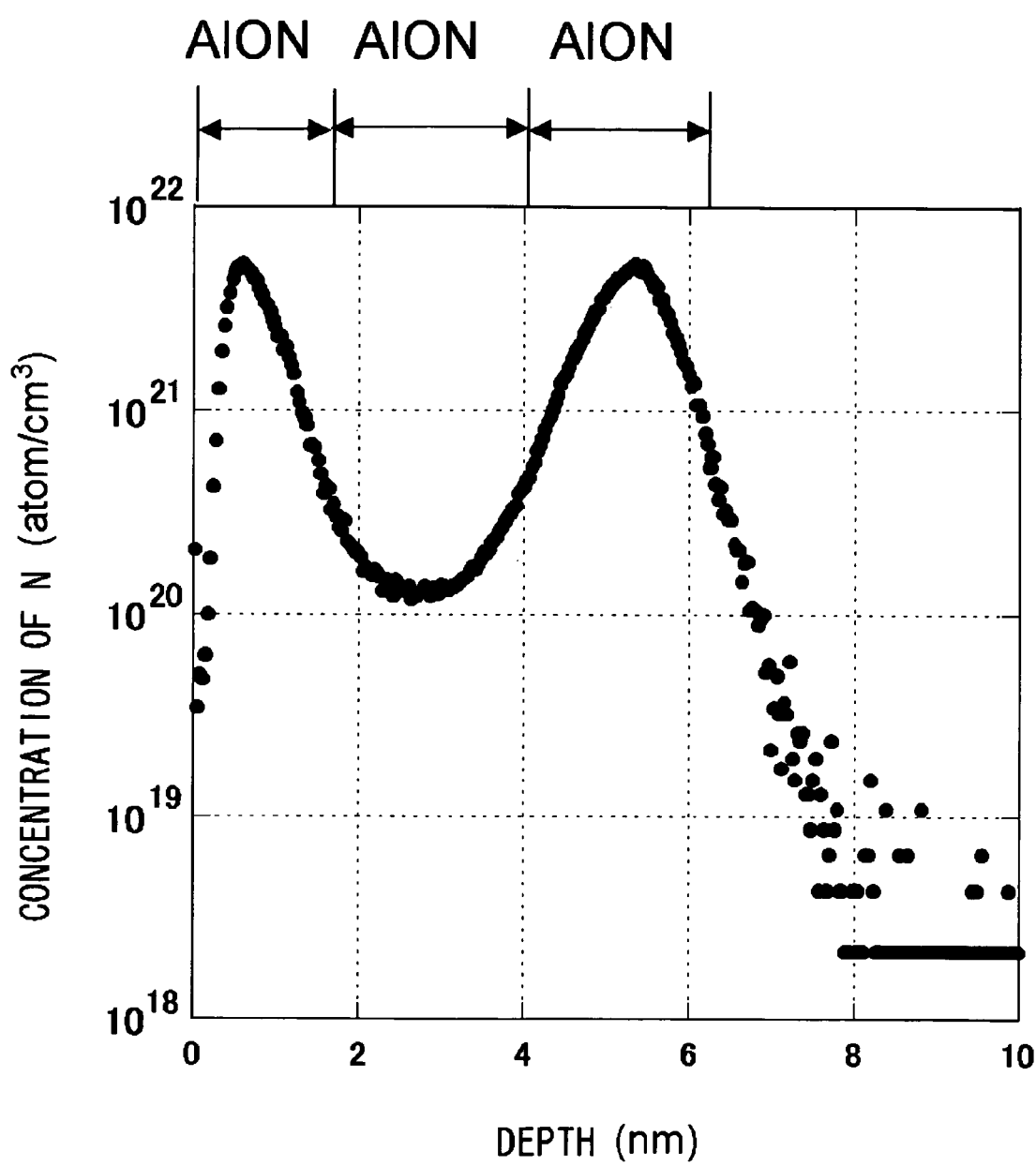
FIG. 11 is a graph showing measurements on the nitrogen concentration profile of a layered film consisting of $Al_2O_3$ and AlON fabricated in a practical example.

A film formed in the same manner as described above was measured by SIMS (secondary ion mass spectrometry) for the distribution of nitrogen concentration in the depth direction. FIG. 11 shows the measurements. In the chart, the top side of the gate insulating film is shown to the left, and the silicon-substrate side to the right. It was confirmed that the film formed on the substrate had AlON layers of different compositions, layered in the order of high, low, and high nitrogen concentrations. In the high-nitrogen regions of the gate insulating film, the maximum nitrogen concentration $M_1$ reached or exceeded $2 \times 10^{21}$ atom/cm$^3$. In the low-nitrogen region, the minimum nitrogen concentration $M_2$ was $2 \times 10^{20}$ atom/cm$^3$ or less. That is, $M_1$ and $M_2$ satisfied $M_1/M_2 \geq 10$.

The transistor obtained in this practical example was measured for $SiO_2$ equivalent thickness. Here, the $SiO_2$ equivalent thickness was calculated from the C—V characteristic for situations where the silicon substrate was grounded and the top gold electrode was subjected to voltages ranging from −2 to 2 V. As a result, the $SiO_2$ equivalent thickness was found to be 1.4 to 2.0 nm. Moreover, this MOSFET was measured for a leak current for situations where the silicon substrate was grounded and a voltage of −1 V was applied to the gold electrode. As a result, favorable leak current characteristics of $10^{-2}$ A/cm$^2$ to $10^{-6}$ A/cm$^2$ were observed.

What is claimed is:

1. A semiconductor device comprising:
   a semiconductor substrate;
   a gate insulating film formed on the semiconductor substrate; and
   a gate electrode formed on the gate insulating film, wherein
   the gate insulating film is a layered film including:
   a first metal compound layer containing a metal compound expressed by the chemical formula $M^1O_xN_{1-x}$;
   a second metal compound layer formed on the first metal compound layer, containing a metal compound expressed by the chemical formula $M^2O_yN_{1-y}$; and
   a third metal compound layer formed on the second metal compound layer, containing a metal compound expressed by the chemical formula $M^3O_zN_{1-z}$, where $1 \geq y > x \geq 0$, $1 \geq y > z \geq 0$, and $M^1$, $M^2$, and $M^3$ each independently represent an element selected from the group consisting of Hf, Zr, La, Al, Si, and Y, and $C_1$ and $C_3$ both reach or exceed $3 \times 10^{20}$ atom/cm$^3$, where $C_1$ is a maximum nitrogen concentration in the first metal compound layer, and $C_3$ is a maximum nitrogen concentration in the third metal compound layer.

2. The semiconductor device according to claim 1, wherein:
   $1 > y > x > 0$ and $1 > y > z > 0$ hold; and
   each of the first, second, and third metal compound layers is one selected from the group consisting of a metal oxynitride layer and a metal nitride layer.

3. The semiconductor device according to claim 1, wherein the layered film is formed by atomic layer deposition.

4. A semiconductor device comprising:
   a semiconductor substrate;
   a gate insulating film formed on the semiconductor substrate; and a gate electrode formed on the gate insulating film, wherein the gate insulating film includes a layered film including layers expressed by the following respective formulas:

$M_r M'_{1-r} O_u N_{1-u}$, and
$M_s M'_{1-s} O_v N_{1-v}$, where $1>r>0$, $1>s>0$, $1\geqq u\geqq 0$, $1\geqq v\geqq 0$, and u and v are different values, and M and M' represent different elements each selected from the group consisting of Hf, Zr, La, Al, Si, and Y.

* * * * *